(12) United States Patent
Groves et al.

(10) Patent No.: US 7,014,889 B2
(45) Date of Patent: Mar. 21, 2006

(54) PROCESS AND APPARATUS FOR PLASMA ACTIVATED DEPOSITIONS IN A VACUUM

(75) Inventors: James F. Groves, Charlottesville, VA (US); Derek D. Hass, Charlottesville, VA (US); Haydn N. G. Wadley, Keswick, VA (US); Goesta Mattausch, Dresden (DE); Henry Morgner, Dresden (DE); Siegfried Schiller, Dresden (DE)

(73) Assignee: University of Virginia Patent Foundation, Charlottesville, VA (US)

( * ) Notice: Subject to any disclaimer, the term of this patent is extended or adjusted under 35 U.S.C. 154(b) by 295 days.

(21) Appl. No.: 10/297,347

(22) PCT Filed: May 23, 2001

(86) PCT No.: PCT/US01/16693

§ 371 (c)(1),
(2), (4) Date: Nov. 21, 2002

(87) PCT Pub. No.: WO01/90438

PCT Pub. Date: Nov. 29, 2001

(65) Prior Publication Data

US 2004/0118347 A1 Jun. 24, 2004

Related U.S. Application Data

(60) Provisional application No. 60/206,379, filed on May 23, 2000, and provisional application No. 60/231,869, filed on Sep. 12, 2000.

(51) Int. Cl.
*H05H 1/24* (2006.01)

(52) U.S. Cl. .................. 427/569; 427/570; 427/595; 118/723 EB; 118/723 FE (58) Field of Classification Search ........... 427/569, 427/570, 595; 118/723 EB, 723 FE
See application file for complete search history.

(56) References Cited

U.S. PATENT DOCUMENTS

| | | | | |
|---|---|---|---|---|
| 5,397,428 A | * | 3/1995 | Stoner et al. | 117/86 |
| 5,457,298 A | * | 10/1995 | Nelson et al. | 219/121.52 |
| 5,458,733 A | * | 10/1995 | Tessmer et al. | 216/67 |
| 5,490,910 A | * | 2/1996 | Nelson et al. | 204/192.15 |
| 5,508,368 A | * | 4/1996 | Knapp et al. | 427/534 |
| 5,635,087 A | * | 6/1997 | Schiller et al. | 219/121.43 |
| 6,663,755 B1 | * | 12/2003 | Gorokhovsky | 204/298.41 |

FOREIGN PATENT DOCUMENTS

| | | |
|---|---|---|
| DE | 196 12 344 C1 | 8/1997 |
| DE | 198 41 012 C1 | 1/2000 |

OTHER PUBLICATIONS

Schiller, Morgner, Schiller and Straach, High Rate Coating of Plastic Films and Plastic Sheets with Clear Oxide Layers, Metallized Plastics 5&6: Fundamental and Applied Aspects, p. 75–84 [corresponding pp. 1–9 herein attached].

* cited by examiner

*Primary Examiner*—Bret Chen
(74) *Attorney, Agent, or Firm*—Robert J. Decker (57) ABSTRACT

Plasma deposition apparatus (1) and method that allows metal or nonmetal vapor (6) to be generated by electron-beam evaporation, guides that vapor using a noble gas stream (containing reactive gases in cases of reactive evaporation), ionizes the dense directed gas and vapor stream at working pressures above about 0.0001 mbar using a hollow cathode plasma arc discharge (11), and conveys the ionized vapor and/or gas stream towards the substrate (4) for impact on the surface at energies varying from thermal levels (as low as about 0.05 eV) up to about 300 eV.

35 Claims, 6 Drawing Sheets

PROCESS AND APPARATUS FOR PLASMA ACTIVATED DEPOSITIONS IN A VACUUM

RELATED APPLICATIONS

This application claims priority from U.S. Provisional Application Ser. No. 60/206,379 filed on May 23, 2000, entitled "Process And Apparatus For Plasma Activated Deposition In Vacuum" and U.S. Provisional Application Ser. No. 60/231,869 filed on Sep. 12, 2000, entitled "Process And Apparatus For Plasma Activated Deposition In Vacuum," the entire disclosures of which are hereby incorporated by reference herein.

GOVERNMENT SUPPORT

Work described herein was supported by Federal Grant Nos. N00014-98-1-0355 and N00014-99-1-0572, awarded by the Office of Naval Research. The United States government has certain rights in the invention.

FIELD OF THE INVENTION

The present invention relates to a process for the plasma activated deposition of an electron beam evaporant, the use of ion assisted methods for controlling atomic assembly, and an apparatus for performing the process.

BACKGROUND OF THE INVENTION

Metallic and non-metallic substrates can be coated by reactive or non-reactive evaporation using conventional processes and apparatuses. Many useful engineering materials are routinely created by depositing thick and thin film layers onto surfaces using physical vapor deposition (PVD). The deposited layers vary in thickness from a few monolayers up to several millimeters. While many techniques are capable of creating layers of varying thickness, business economics in numerous market segments dictate that the most successful techniques will be able to create layers quickly and efficiently while also generating the precise atomic scale structures that bestow the engineering properties needed for the application. To create layers quickly, a process must be able to generate large amounts of vapor rapidly. To create layers efficiently, a process must be able to transport and deposit the majority of the vapor to specific desired locations, and mediate their assembly on the condensing surface to create structures of technological value.

Several methods can be used to organize atomic assembly to create a desired structure. For example, the substrate temperature, the deposition rate and the angle of incidence of the flux with the substrate where deposition occurs all affect the assembly process and therefore the resulting structure.

The capability of providing desired rapid, efficient, directed energy techniques, such as for thick and thin film coating applications, have continually alluded conventional practices. For some applications, high vapor atom energy (>20 eV) is needed to induce selective sputtering. For example to control grain texture by the selective removal of some crystal orientations. In other applications, medium energy (10–20 eV) is needed to densify the film and control its grain size and residual stress. In other cases (particular the growth of multilayers) modulated/pulsed low energy (<10 eV) deposition is used to grow each new layer. This low energy technique enables surfaces to be flattened without causing intermixing of the interfaces. Assisting ions with similar atomic masses to deposited species and with energies in the same three regimes can also be used to augment the deposition.

Speed

While conventional e-beam processing can be performed at very high rates, the vapor from a conventional e-beam source rapidly disperses as it moves away from its point of origin. As a result, the vapor from a conventional e-beam source leaves the feed stock with a density distribution often described by a $\cos^n \theta$ ($\theta$: angle to normal axis) function where n ranges from 2 to 5. This diffuse distribution leads to coating nonuniformity for large area arrays and extremely low deposition efficiencies when coating, for example, small or curved surfaces such as 100 $\mu$m diameter continuous fibers with metal (to make composites) or 3 cm long aircraft engine turbine blades with ceramic (to make thermal barrier coatings). When a gas is introduced into the process chamber for reactive evaporation, the focus of the evaporant may become even worse ($\cos^1 \theta$) as the result of collisions between the vapor stream atoms and background gas atoms in the chamber.

Efficiency

U.S. Pat. No. 5,534,314 to Wadley et al, of which is incorporated by reference herein, shows the efficiency of deposition in electron beam systems is enhanced by capturing vapor in a carrier gas stream as soon as it leaves the evaporator source so that it can be directed to a substrate as a focused beam for high rate, efficient deposition.

Energy

While the above described technologies combine deposition speed and efficiency, extensive study has demonstrated that they lack some key ingredient that allows them to form high quality layers possessing a wide range of easily selected microstructures—from porous, columnar to fully dense polycrystalline. They have a limited ability to combine efficient, high rate deposition with precisely selected deposition energies.

To generate plasma activation in a physical vapor deposition system, many technical variants based on low-pressure plasma discharges like glow-discharge plasma, thermionic cathode plasma, radio-frequency plasma and microwave plasma, with magnetic amplification, have been developed and applied for this purpose.

Despite the capabilities of some of the techniques just listed, their use has been confined to systems that do not operate in the $10^{-2}$ to 10 mbar regime of the present invention directed vapor deposition technique. Instead, because of their underlying inherent performance characteristics, their practical use is restricted to operation in a pressure range between $10^{-4}$ mbar and 0.1 mbar. Clearly, the important pressure regime used for rapid, efficient gas-guided vapor deposition is only partly covered by these conventional plasma processes.

Not only do these standard plasma techniques have difficulty operating in the higher pressure regime of directed vapor deposition but also they have a limited ability to ionize gas and vapor atoms in a system at any pressure. As long as the gas and vapor density in a system is relatively low, the listed techniques are capable of ionizing large percentages of the total atomic density. However, once the atomic density increases (e.g. in the high rate, elevated pressure regime of electron beam directed vapor deposition), the plasma density that can be created with these discharges is too small to achieve any effective improvement of the density in the deposited layers (See S. Schiller, H. Morgner, N. Schiller and S. Straach, *High Rate Coating of Plastic Films and Plastic Sheets with Clear Oxide Layers*, Paper presented on 1997 Joint International Meeting ECS/ISE in Paris, Aug. 31–Sep. 5, 1997, paper published in Metallized Plastics 5&6: Fundamental and Applied Aspects, p. 75–84; of which is hereby incorporated by reference in its entirety).

Although techniques like glow-discharge plasma, thermionic cathode plasma, radio-frequency plasma and microwave plasma, with magnetic amplification, are unable to create high plasma densities, it is known that a very high plasma density can be achieved by low voltage arc discharges (e.g. hollow cathode arc discharges). In the most commonly used setup of these discharges, the directed share of the plasma electrons (the beam electrons) is guided into the evaporator crucible, which is configured to act as an anode. For instance, as shown in U.S. Pat. No. 3,562,141 to Morley, of which is hereby incorporated by reference in its entirety, evaporation occurs due to absorption of kinetic energy of the low energy beam, and at the same time plasma ionization occurs in the system. However, this method cannot be transferred to gas stream guided vapor deposition. However, to penetrate the high particle density of a gas and vapor directed vapor deposition system, it is necessary to apply very high acceleration potential to the electrons (e.g. 60–70 kV for electron acceleration in Wadley et al. system), and therefore precludes use of this type of low voltage arc configuration in directed vapor deposition systems.

Another gas jet film deposition system uses a noble gas plasma jet formed by a nozzle with a thermionic electron emitter inside. The gas plasma jet is targeted on the evaporant or evaporation crucible acting as anode. The vaporized particles will be entrained in the gas plasma jet which continues its flow to a substrate (See U.S. Pat. No. 5,571,332 to Halpern; of which is hereby incorporated by reference herein).

In this Halpern configuration the plasma discharge is extended only in the noble gas atmosphere between the thermionic cathode and the evaporant as anode. So the vapor particles are not included in the discharge area. Therefore the jet after passing the anode consists mainly of neutral and ionized gas particles and neutral vapor particles. Ionization of vapor particles can happen only in a low degree by charge transfer.

This Halpern method is not suited for high rate deposition by two reasons. Firstly, the energy available for evaporation is mainly supplied by the anode fall of the plasma discharge. This energy is insufficient for high rate evaporation. Secondly, the density of plasma by thermionic electron emission is comparably much lower then the plasma by hollow cathode arc discharge and the vapor is not exposed directly to the fast electrons accelerated in the cathode fall. Therefore, a dense vapor plasma is necessary for high degree of activation at high rates can not be generated by Halpern.

In other experimental setups, low voltage arc sources, in particular hollow cathode arc sources, are used in an independent arrangement exclusively for activation of the vapor near a large-surface substrate (See German Patents DE 42 35 199 C1, DE 196 12 344 A1, DE 38 14 652 C2; all of which are hereby incorporated by reference in their entirety). Still, these arrangements are not well suited for plasma activation of a concentrated vapor beam with very high particle density flowing with high velocity. The patents cited above aim at plasma activation of an extended substrate surface with high degree of uniformity. Therefore the concentrated, unextended plasma from the cathode of the hollow cathode arc source will be spread utilizing for activation the much fewer dense plasma of the positive column in a certain distance from the cathode. The spread plasma does not match effectively with the localized gas and vapor stream. The large distance between the cathode orifice and the vapor will result in thermalisation of fast electrons in a high pressure directed vacuum deposition system before reaching the vapor particles which are concentrated in the carrier gas stream. Effective plasma activation of the jet will not take place in the above-listed German references.

Furthermore, the arrangements of the above-listed German references, use magnetic fields for the guidance of the plasma. Such magnetic fields can not be strongly localized resulting in an unacceptable interference of the high-energy e-beam impacting its ability to function properly for evaporation negatively.

For directed vapor deposition systems, a better plasma source configuration appears to be that described in DE 19841012 (herein after "DE'012"); of which is hereby incorporated by reference in its entirety. Here a hollow cathode arc plasma source, with a ring anode nearby the cathode orifice, is used in combination with a magnetic field and a ring-shaped anode to enclose the focused gas and vapor stream. The hollow cathode is arranged such that it is a considerable distance from the vapor beam, and electromagnetic field-lines are allowed to draw the directed electrons from the hollow cathode arc plasma source partly to the substrate and partly to the ring-shaped anode.

Still, this DE'012 configuration has several substantial drawbacks. First, the pathway for the electrons of the directed low voltage electron beam, from the orifice of the hollow cathode tube to the vapor beam, is too long. This results in a drastic energy loss for the low voltage beam electrons in the isotropic residual gas surrounding the vapor beam. The energy loss occurs before the beam has even entered the region of the gas stream guided vapor due to the scattering processes in the dense residual gas. This scattering gains importance for vacuum pressures above 0.05 mbar where elastic and inelastic scattering of electrons in the residual gas results in a decreased degree of plasma activation in the vapor and a corresponding decrease in the self bias voltage on the substrate surface. It is not unreasonable to experience a drop in the self bias voltage on an insulated substrate surface from typical levels of 15–20V for hollow cathode arc plasma activated processes in the lower pressure range to just a few volts, purely because of energy losses in the electrons. The self bias voltage is a critical factor, which determines the energy of condensing vapor ions and consequently the effect of plasma activation on layer properties. For example, for high deposition rates above 10 $\mu$m per minute a low degree of plasma activation will result in only a weak improvement of layer properties.

Second, this DE'012 configuration needs external magnetic field for plasma guidance. Due to the small distances in DVD configuration the magnetic fields from the plasma guidance and the strong circular magnetic field surrounding the power supply cables and the plasma discharge resulting from the high discharge current of the hollow cathode arc discharge, typically in the range of about one hundred amperes, leads to relatively high magnetic field strengths could negatively impact the ability of the high energy e-beam to function properly for evaporation. The execution example in the patent DE 19841012 (of which is incorporated by reference in its entirety) shows a shield between the plasma source and the evaporation e-beam's pathway for decoupling the evaporation e-beam from magnetic disturbance. However, the shielding must be kept outside the vapor channel. This means that shielding is not possible in the vicinity of the vapor source crucible. This restrictions makes it difficult to ensure that the e-beam pathway close to the crucible is not influenced by the magnetic field of the plasma discharge in the system configuration described in DE'012. Nonsystematic deviations from constant plasma conditions can often occur in hollow cathode arc discharges, leading to sudden, undesirable shifts in the position of the evaporation spot in the crucible. Such position shift of the evaporation spot makes the evaporation unstable, especially from crucibles with small diameter. There is therefore a need in the art wherein hollow cathode arc discharges can be advantageously incorporated into the directed vapor deposition process.

Finally, while Wadley et al. provides that an ion assisted directed vapor deposition is conceivable, no teaching about how such a process might be realized is provided, and there may have been an assumption that the high voltage electron beam (60 kV) would be used for source evaporation that might interact with gas and vapor in the process chamber to generate large percentages of ionized gas and vapor for deposition. However, high voltage electrons are not well suited to the creation of high ionization percentages due to the dramatic decreasing of the ionization cross section with high electron energy. Instead, a low energy beam as described in the present invention is much better suited to creation of large numbers of ionized species in a physical vapor deposition system.

Figure 5:
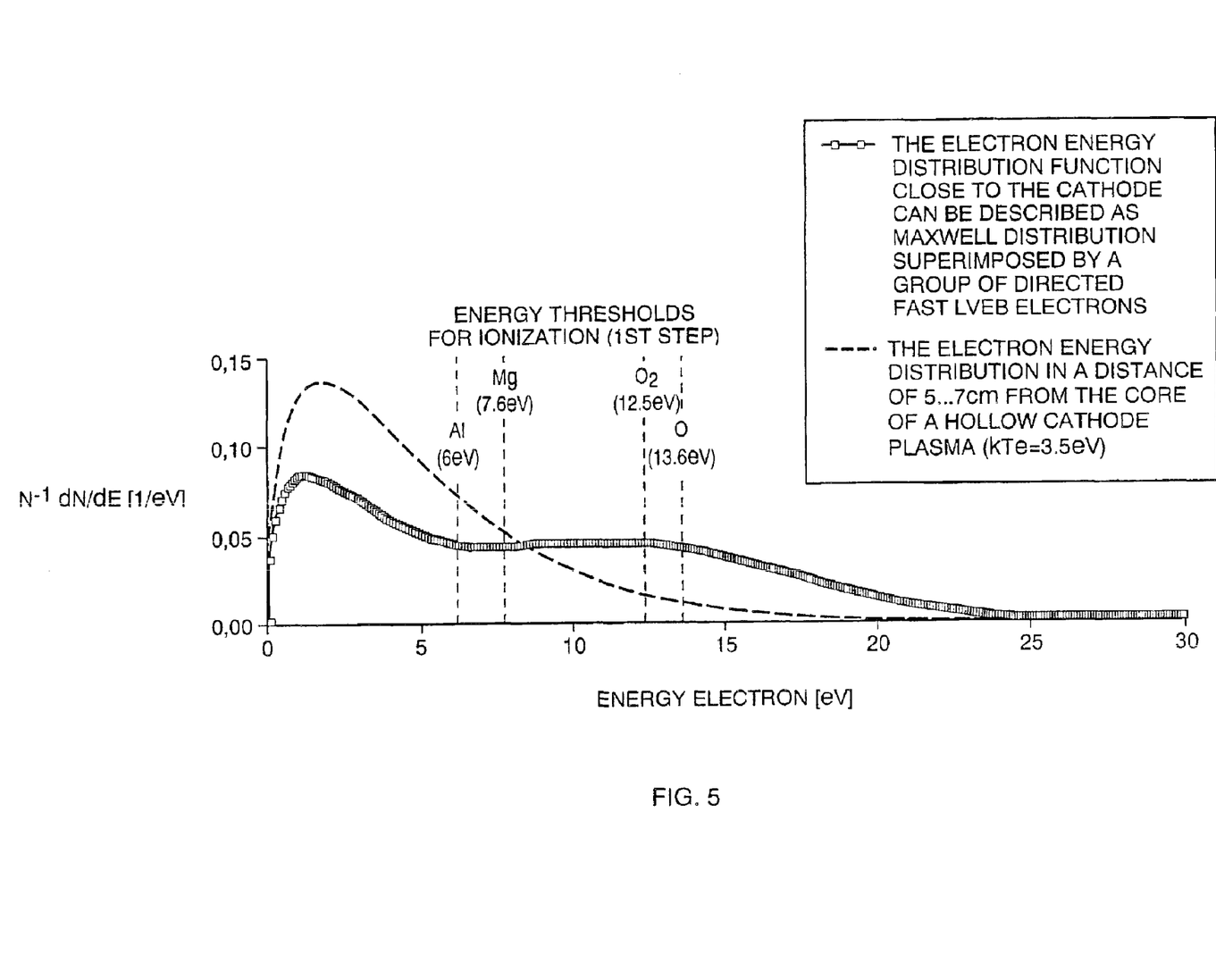
FIG. 5 provides a curve for the Maxwellian electron energy distribution, which is typical for the plasma in a certain distance from the cathode.

Steep increase of ionization cross section for electron energy exceeding the ionization threshold energy with growing energy is well known. The hollow cathode arc discharge source is characterized by emitting of directed electrons, also called as low voltage electron beam, with an enhanced energy compared to the isotropic electrons in the plasma. The graph in FIG. 5 provides two curves. The thin plot shows a typical electron energy distribution of a hollow discharge arc plasma, which can be found typically away from the cathode in a certain distance. This curve can be described as Maxwellian distribution. The thick squared curve represents the typical distribution close to the cathode of a hollow cathode arc discharge consisting of a peak from the isotropic electrons on the left and the portion of the directed electrons on the right side. The energy distribution of the directed electrons with a mean energy of about 12 eV exceeds to a large portion the ionization threshold of vapor particle and reactive gases enabling very effective ionization of vapor and gas Other prior art systems and method are captured in U.S. Pat. No. 5,635,087 to Schiller et al. and U.S. Pat. No. 4,941,430 to Watanabe et al., and are hereby incorporated by reference.

To expand the viable applicability of plasma activated electron beam directed vapor deposition technology, processes and systems are needed which are inter alia:

1. Capable of rapidly varying the energy of depositing atoms across the entire energy range from 0.05 eV to 300 eV.
2. Able to introduce plasma activation electrons from a directed low voltage electron beam directly into a focused gas and vapor stream destined for deposition.
3. Free from the disturbing influences of magnetic fields generated by the high current of the plasma activation unit.
4. Controllable (well defined energy modulation in the plasma activation unit and the substrate bias system).
5. Efficient (ionizing as much of the gas and vapor stream as possible).
6. Flexible (allowing many different gas and vapor types to be activated using a one or more plasma activation units.
7. Not operator intensive (i.e., continuous, automated, and reliable).

BRIEF SUMMARY

Accordingly, one object of the present invention is to create a process and an apparatus that allow metal or nonmetal vapor to be generated by electron-beam evaporation, guide that vapor using a noble gas stream (containing reactive gases in cases of reactive evaporation), ionize the dense directed gas and vapor stream at working pressures above about $10^{-4}$ mbar using a hollow cathode plasma arc discharge, and convey the ionized vapor and/or gas stream towards the substrate for impact on the surface at energies varying from thermal levels (as low as about 0.05 eV) up to about 300 eV.

A further object of the present invention is to provide a process and apparatus which allows the plasma activation of the condensing vapor to provide, both for nonreactive as well as reactive deposition, carefully selected density structures on conductive as well as on nonconductive substrate surfaces. The effectiveness of the process and the apparatus should be guaranteed in a pressure range from about $10^{-4}$ mbar up to about atmospheric pressure.

Still yet, a further object of the present invention is to provide a process and apparatus which allows the plasma activation of vapor, which is entrained in a gas stream, to provide for conveying the ionized particles by stream despite the strong steadily charge carrier loss.

Moreover, a further object of the present invention is to provide a process for plasma activating electron beam directed vapor deposition using a hollow cathode arc discharge which makes efficient use of the electrons of the directed low voltage electron beam that it generates to ionize gas and vapor atoms in a focused flow.

Furthermore, an additional object of the present invention is to provide a process for plasma activating electron beam directed vapor deposition which uses a hollow cathode arc discharge for the extreme energy modulation of vapor and gas atoms ionized by the discharge's directed low voltage electron beam so that well defined thick and thin film layers can be created with distinct layer compositions, graded properties, distinct interfaces, residual stress control, and atomic structure (e.g. nanostructure and microstructure) control.

In addition, an object of the present invention is to provide a process for plasma activating electron beam directed vapor deposition which uses a hollow cathode arc discharge for the extreme energy modulation of vapor and gas atoms ionized by the discharge's directed low voltage electron beam in a sequence of predetermined steps, using different evaporants and reactive gases in each step, including steps without plasma activation, so that well defined layer stacks with very distinct single layer properties can be created.

Finally, a further object of the present invention is to provide an apparatus for plasma activating electron beam directed vapor deposition which uses a hollow cathode arc discharge and which is continuous, automated, reliable and neither operator or capital equipment intensive.

These and other objects, along with advantages and features of the invention disclosed herein, will be made more apparent from the description, drawings and claims that follow.

DESCRIPTION OF FIGURES

The foregoing and other objects, features and advantages of the present invention, as well as the invention itself, will be more fully understood from the following description of preferred embodiments, when read together with the accompanying drawings, in which:

FIGS. 2–3 show a schematic sectional view of select components of FIG. 1 viewed along cut section II—II, wherein the anode and/or cathode change positions or directions thereby affecting operation.

DETAILED DESCRIPTION OF INVENTION

The present invention relates to a process, and system for performing the process, for plasma activating electron beam directed vapor deposition comprising the following, among other things. Firstly, presenting a gas and vapor stream to a plasma activation unit or chamber unit, wherein the vapor stream is generated by a high voltage electron beam gun, and wherein the plasma activation unit has an operating pressure of from about $10^{-3}$ mbar to about atmospheric pressure and has coupled thereto a substrate bias system capable of applying a DC or alternating potential to a coating surface. Secondly, impinging the gas and vapor stream with a low voltage electron beam generated by at least one hollow cathode arc plasma activation source to ionize the gas and vapor stream. Thirdly, attracting the ionized gas and vapor stream to a substrate surface by allowing a self-bias or an applied DC or alternating bias to pull the ionized stream to the substrate, and an apparatus for performing the process.

In particular, the physical vapor deposition (PVD) material process and apparatus described herein represents a new, useful, and nonobvious method for rapidly and efficiently depositing thick and thin layers of material at a wide variety of energies. The present invention method and apparatus achieves inter alia all three important processing goals—high rate, high efficiency, and varied energy. The invention described herein represents a novel and non-obvious solution for plasma processing and directed vapor deposition. The novelty, utility, and inventiveness of the proposed solution will be demonstrated through the following description of the apparatus and process.

For example, in thermal barrier coatings (TBC), energy modulation of the present invention could allow a fully dense bond coat layer (e.g. platinum aluminide) to be deposited at high energy prior to lower energy deposition of a porous columnar yttria-stablized zirconia top coat. The ability to deposit both the bond coat and top coat in one chamber represents the type of unique processing that is possible in this present invention plasma-assisted directed vapor deposition system. Additionally, the present invention DVD process has demonstrated some ability to vary deposit density through careful changes in gas and vapor flow. This ability could be enhanced through the use of plasma-assisted energy modulation. Such density variation could allow PVD deposited thermal barrier coatings to reach previously unattainable low thermal conductivities.

In addition, the creation of alternating porous and fully dense layers of the present invention process enables the creation of one-dimensional photon band gaps, which inhibit the propagation of thermal radiation from the surface to the substrate. Fully dense layers on top of the porous thermal barrier coating top coat is useful for preventing environmental degradation of these coatings in industrial applications. Also, using a bombarding gas plasma, with no metal or ceramic vapor, will densify the top portion of the top coat layer. In this case, bombardment of the top coat with heavy noble gas atoms having approximately 25–200 eV could perform a post-deposition modification of the porous columnar atomic structure (e.g. nanostructure and microstructure).

The present invention plasma-assisted directed vapor deposition is unique in its ability to deliver rapid, efficient, and energy modulated coating. The use of plasma assistance in the low vacuum environment of directed vapor deposition (approximately $10^{-2}$–10 mbar) is distinctly different than employing energy modulation in the higher vacuum environment of an ion beam (sputtering) deposition (IBD) system (See U.S. Pat. No. 5,492,605 to Pinarbasi, which is hereby incorporated by reference herein). While the IBD systems can deliver deposition rates only up to 1–5 $\mu$m per minute, the present invention plasma-assisted directed vapor deposition can deliver energy modulation during deposition at rates of at least 100 $\mu$m per minute.

Furthermore, referring to the present invention, by seeding a carrier gas (typically helium) flow with other ionizable gases such as xenon, argon, oxygen etc, assisting ion fluxes comparable or greater than that of the depositing species can be formed and used to manipulate atomic assembly.

The present invention DVD process having hollow cathode arc plasma and pulsed bias applied to the substrate enables the deposition of layers with high efficiency with a wide variety of materials to be deposited in a reactive or nonreactive way. It further enables a wide variety of the atomic structure (e.g. nanostructure or microstructure) and therefore the properties of the material to be deposited. It also enables, the introduction of etching/cleaning and heating phases using the same tools as for vapor plasma activation and the possibility of fast changes of material, material composition and atomic structure (gradient properties) in one deposition run.

The present invention DVD system having a hollow cathode arc plasma activation and pulsed bias on the substrate provides for long term stability under low vacuum conditions from about 5 mbar up to about atmospheric pressure. The vapor, created with an electron-beam heating source can be successfully entrained in a directed flow of noble or other gas, containing a reactive gas if requested, guided towards the substrate passing the hollow cathode arc plasma source close to the cathode orifice, and ionized to a high degree by fast low energy electrons. Wherein the fast low energy electrons are beam-like emitted by the cathode, and wherein the ions can be accelerated towards the substrate in the electric field of plasma sheath. The voltage determining the energy gain of ions is created by DC bias for conductive layers or by medium frequency pulsed bias for nonconductive layers.

Figure 1:
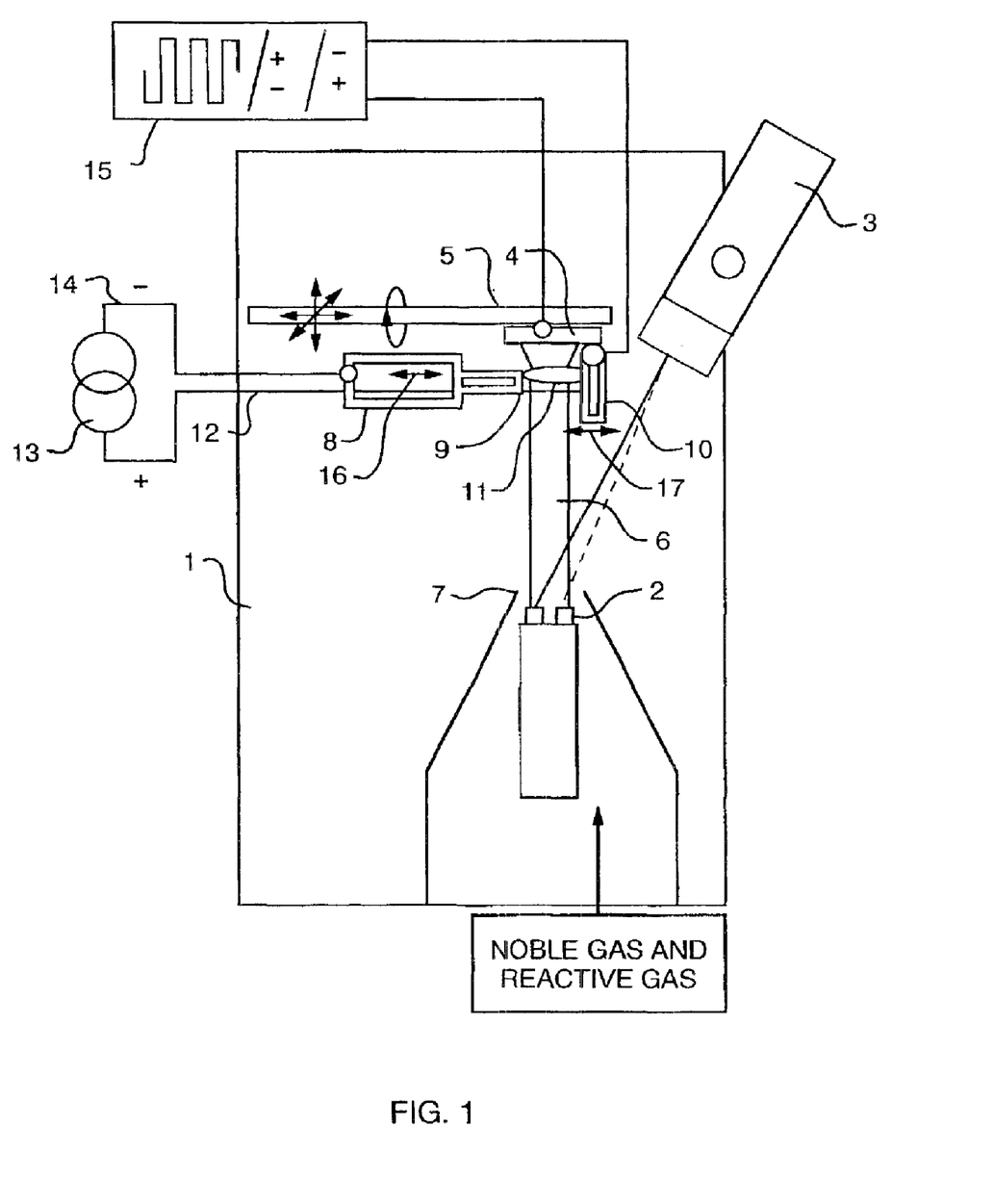
FIG. 1 shows a schematic representation of an apparatus used to perform the present process.

The major components of the present invention DVD system including a hollow cathode arc plasma activation and substrate bias supply, as described herein is shown in the schematic assembly drawing of FIG. 1. The present invention DVD system is comprises a vacuum chamber 1, a rod feed evaporator 2 that is placed which is heated up to evaporation temperature of evaporant by the electron-beam of an electron gun 3 and provides the vapor for coating of substrates 4. Vaporized evaporant is entrained in the supersonic gas and vapor stream 6 formed by the nozzle 7. The substrate(s) 4 are fixed at a substrate holder 5 which enables shift of the substrate in any independent direction and to be swiveled. For example, the translation motion in the horizontal plan allows the exposed surface areas of the substrate to the vapor stream for defined dwelling times and control of the local coating thickness. The vertical motion can be used to keep constant the distance between plasma and surface for curved substrates. Swivel motion, in coordination with the translation motions, can be used to enable the coating of complete three-dimensional parts or can be used also to change the incidence angle of the vapor particles in the course of layer coating in a defined way for getting distinct layer properties. The hollow cathode (arc source) 8 is placed laterally below substrate holder 5 with a short distance between the cathode orifice 9 and the gas and vapor stream 6. The anode 10 is arranged opposite the cathode orifice 9 (i.e., on an approximate distant side of the stream 6) so that the fast electrons and the plasma discharge 11 crosses the gas and vapor stream 6. The fixtures for the cathode 16 and for the anode 17 provides the ability to adjust the distance of the cathode 8 and the anode 10, thereby influencing the diameter and the shape of gas and vapor stream 6.

The plasma discharge 11 is in close proximity (arranged with short distance) to the surface of the substrate 4 enabling close contact between dense plasma and the substrate surface to be coated. In the vicinity of the evaporation electron-beam from the electron gun 3, the anode power line 12 from the power generator 13 to the anode 10 is arranged closely and in parallel with both the plasma discharge 9 and the cathode power line 14, which runs from the cathode to the power generator 13. Between the substrate 4 and the anode 10, a bias generator 15 is applied that allows for generation of a positive, a negative or a periodically alternating voltage between the substrate 4 and the plasma 11.

Figure 2A:
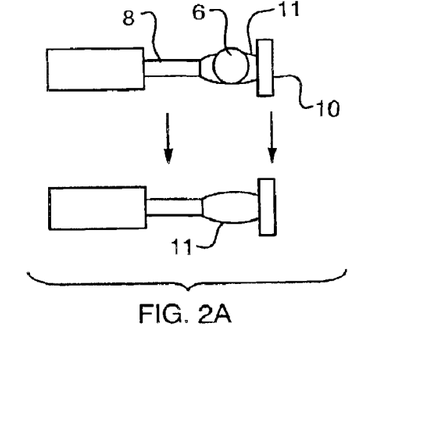
Figure 2B:
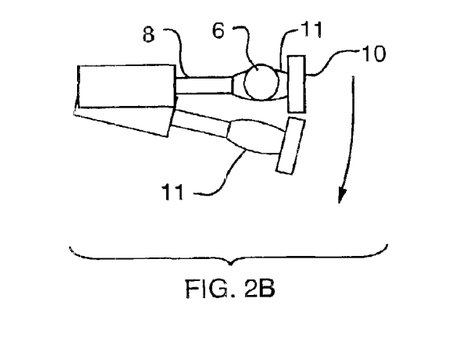

Turning to FIGS. 2A–2B, FIG. 2A demonstrates the horizontal shift of the cathode 8 and anode 10 from an initial position to a secondary position, while still maintaining the plasma discharge. FIG. 2B demonstrates the horizontal turn of the cathode 8 and anode 10 arrangement away from the vapor-gas-jet 11, while still maintaining the plasma discharge.

Figure 3A:
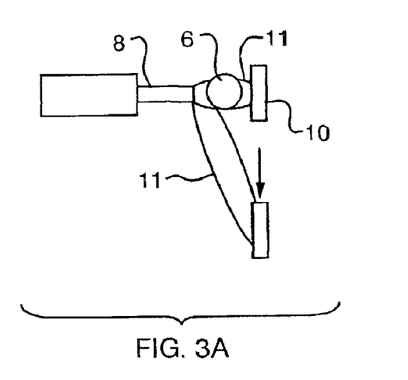
Figure 3B:
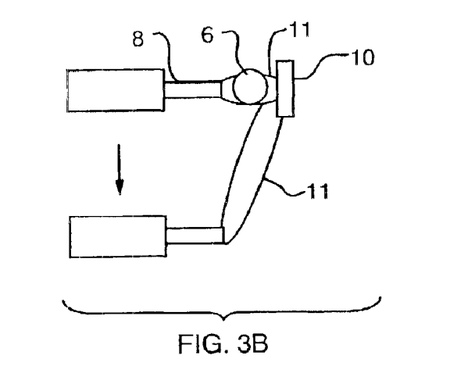

Next, turning to FIGS. 3A–3B, FIG. 3A demonstrates the displacement of the plasma discharge 11 away from the gas and vapor stream 6 by moving sideward (i.e., horizontally) the anode 10 only. Similarly, FIG. 3B demonstrates the displacement of the plasma discharge 11 away from the gas and vapor stream 6 by moving only the cathode 8 sideward.

Figure 4:
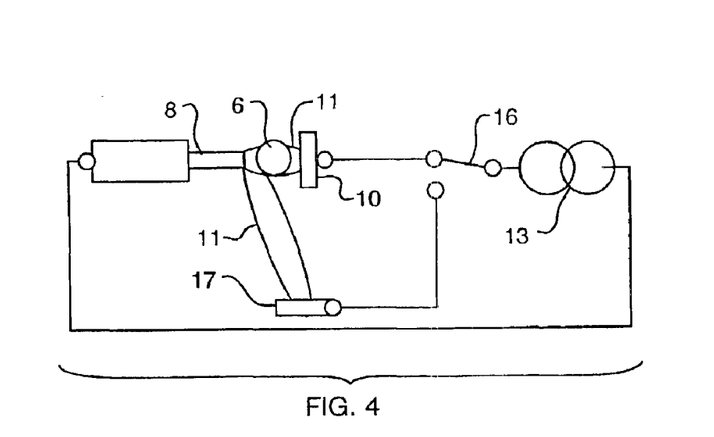
FIG. 4 shows a schematic sectional view of select components of FIG. 1 viewed along cut section II—II, wherein the anode is replaced with an auxiliary anode thereby affecting operation.

Moreover, FIG. 4 demonstrates the displacement of the plasma discharge 11 away from the gas and vapor stream 6 by switching the power supply 13 with the switch 18 from the active anode 10 to an auxiliary anode 19.

Figure 8:
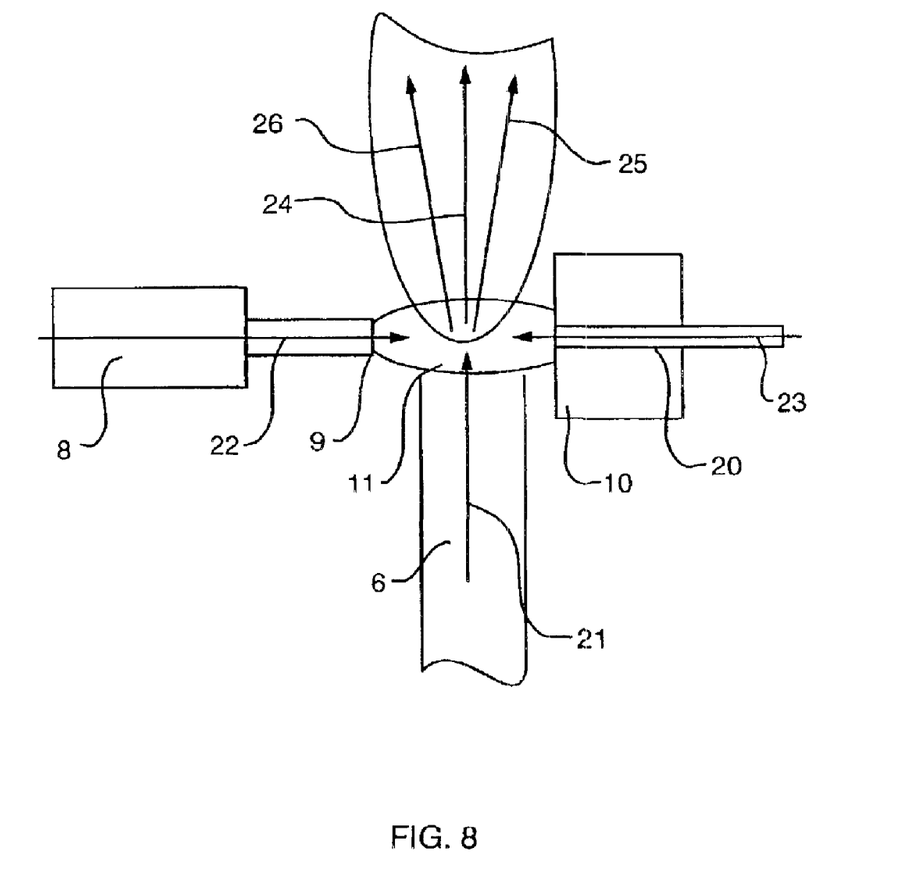
FIG. 8 shows a schematic representation of an alternative embodiment of the present invention, demonstrating the deflection of the main gas and vapor stream and a compensation of it by of an opposed gas injection from the anode.

Referring to FIG. 8, FIG. 8 schematically illustrates an alternative embodiment wherein the instant system and method has the main gas and vapor stream 6 which is deflected from the vertical direction 21 by interaction with the working gas flow 22 of the hollow cathode 8 escaping from the cathode orifice 9 resulting in a bending of the vapor stream 25 away from the cathode side. The directed gas injection 23 is in an opposed position to the cathode through a gas channel 20 integrated in the anode block 10 and enables the compensation of deflection. Therefore, the resulting gas and vapor stream 24 flows in the vertical direction again. Overcompensation will result in a bending of the main gas and vapor stream 26 towards the cathode side. The same channel 20 can be used for clear gas influx to keep free the anode or parts of the anode surface from insulating contamination. This clear gas influx feature can been done independently or in combination with the bending effect injection of the anode.

In a preferred embodiment, DVD system incorporates, approximately, a 70 kV/10 kW electron beam gun 3 and up to four evaporation crucibles 2 with continuous rod feeding arranged in the center of the ring nozzle 7 forming the directed flow of noble gas ready to be entrained by the vapor. The e-beam gun 2 is equipped with a fast dynamic beam deflection and focusing system with an upper cutoff frequency of about 100 kHz for the typical deflection angle of about 5°. The high deflection frequency is the necessary precondition for beam skipping between the maximum four crucibles and rastering of evaporation pattern for distributed heating of the evaporant sources in a controlled and defined manner. Low thermal inertia of the small crucibles in combination the high deflection frequency and a maximum rate of acceleration for the evaporation power of about 0.3 kW/ms in the controlled operation mode enable fast changes in deposition rate and composition ratio for the evaporation of materials from different crucibles.

The carrier gas flux for the directed flow can be adjusted from zero to about 20 slm. The pumping system, including a combination of mechanical roots, pumps and an oil booster pump with a maximum nominal pump speed of 15 000 l/s can be operated in different modes for downgrading the pump speed. So the shape of the vapor distribution can be varied from the natural distribution function $\cos^n \theta$ (n=2 . . . 5) to a beamlike distribution which can be described by exponent n=25 or higher. In this way the opening angle of vapor cloud cone can be varied for adaptation to the substrate size.

The hollow cathode arc plasma source 8 is arranged close to the vapor cloud or stream 6 and close to the substrate 4. The distance to the vapor cloud can be varied to a position where the cathode orifice is close to the outer boundary of the vapor cloud or stream. Wherein the distance between the cathode orifice and the outer boundary of the vapor cloud or stream is preferably between 0 cm to about 5 cm. The width of plasma activated area also will increase with growing distance of the cathode 8 because of the directed fast low energy electrons underlie a cloudlike distribution function. So the plasma discharge shape can be matched effectively to the vapor cloud shape.

The anode 10 is designed as a simple block anode for processes without deposition of non-conductive randomly growing layers, or alternatively as a gasshowered anode, upheated anode, or hidden anode, or the like to avoid loss of conductivity on the anode surface in reactive deposition processes. Position variation for adaptation is possible using a cathode adjustable fixture 16 and an anode adjustable fixture 17.

The variation of hollow cathode arc discharge current from about 20 A up to about 350 A enables variation of plasma activation degree and of the ion impact flux on the substrate 4 accordingly in a very wide range. Due to the conveyance of the plasma particles to the substrate 4 by gas flow, the ion impact flux increases approximately by a factor of two when compared to of the ion impact flux measured under isotropic gas conditions.

The substrate holder 5 allows positioning and turning of the substrate 4 in all directions to manage exposing of each area portion with regard to dwelling time and particle incident angle in a very defined manner.

The bias power supply 15 enables application of DC voltage with negative polarity on the substrate for ion attraction. So the ion energy can be adjusted from self bias potential of the plasma up to about 300V external bias.

The application of positive polarity to the substrate allows substrate pre-heating/heating by electron bombardment. To avoid exceeding of the installation power by the electron current, which is typically more than about two orders of magnitude higher than the ion current without reducing of voltage, a unipolar pulsed mode may be applied. The duty cycle times are adjustable to utilize the full power range for substrate heating purposes.

For coating or etching/cleaning of nonconductive layers on conductive substrates bias conditions are generated by permanent change of polarity pulsing with medium frequency. The pulse voltage can be chosen from zero to about 300 V. The positive and the negative on times as well can be adjusted from about 8 to 815 $\mu$s. The minimum duration of off times is 2 $\mu$s for each polarity. Cycle frequency ranges from 50 kHz to 600 Hz accordingly. The wide range of duty cycles enables an adaptation to different substrate conditions (decreasing capacity for growing thickness of nonconductive layers) and for technological set points as well.

The invention combines the gas stream guided EB evaporation (or directed vapor deposition DVD) with very high deposition rates up to about 100 $\mu$m/min with a very effective plasma activation, especially in the vacuum pressure range above about $5-10^{-3}$ mbar. In that case, the evaporation can be carried out from one evaporator crucible or also from several evaporator crucibles arranged close together for deposition of alloy coatings, mixing layers or also for gradient layers.

The cathode orifice of the hollow cathode arc discharge source is arranged above the evaporator crucible(s), at a height where the vapor is already included from the gas jet. The cathode orifice is placed as close as possible without disturbing the flow of the gas and vapor stream. The arrangement of the anode occurs on the opposite edge of the gas and vapor stream. The anode is placed far enough to avoid interference with the gas and vapor stream flow. This arrangement makes it possible to ionize the dense vapor and the dense gas in the sphere of the gas and vapor stream very intensively. Therefore, the energetic electrons from the low voltage electron beam of the hollow cathode arc discharge source are available nearly with unreduced kinetic energy for ionization processes in the gas and vapor stream. The particles in the gas and vapor stream are ionized for a high part after passing the plasma discharge.

The present invention provides a means of introducing a low energy electron beam that creates an un-extended plasma directed from the hollow cathode orifice directly into the focused vapor-gas-jet. As a result, the spatial constraints of the present invention are simply and efficiently obtained for this plasma activation DVD approach. In this way, the integration of the plasma discharge also becomes possible for short distances between evaporation crucible and/or gas nozzle and the substrate to be coated.

Beyond that, the short cathode-anode distance makes it possible to place the electric feed for the cathode locally close to the electric feed to the anode. In this way, a mutual compensation of the magnetic fields of the plasma discharge current is possible and its disturbing influence onto the electron-beam of the evaporator can be avoided. Also, as can be appreciated by the discussions of the invention herein, the cathode power line 14 and the anode power line 12 are placed close to one another. The discharge current through power lines generates circular magnetic field lines surrounding each power line. The current flows forward through the anode power line 12 generating magnetic field in one direction and flows back via the plasma 11, hollow cathode 8 and hollow cathode power line 14 generating a magnetic field with same strength but other direction. For distances where the current path is greater than the distance between the anode power line and cathode power line the resulting magnetic field is nearly zero (i.e., cancellation of magnetic fields).

For deposition of very dense electrically insulating layers on electrically conductive substrates, an increase in density and homogeneity of the coatings are achieved by using a pulsed bias voltage in combination with the high ion current density that is generated by the hollow cathode arc plasma.

The present invention also includes the power supply 13 that enables a medium frequency bipolar pulsed voltage with pulse voltage in the range of abut 10V up to about 300V and an adjustable duty cycle from about 1:1 to about 1:100. Accordingly, by the appropriate regulation of hollow cathode arc discharge current, pulse voltage and pulse duty cycle, the part of the condensing particles with enhanced energy as well as the energy of the particles itself may be adjusted in a wide range. In addition to the purposeful regulation of the layer properties for residual stress atomic structure (e.g. nanostructure or microstructure) and density, the instant invention also includes the ability to achieve gradient characteristics by changing the parameters while coating.

The present invention provides a method and system of generating a plasma within the propagation path of the condensable vapor and using it to ionize and accelerate condensable species towards a substrate. The same plasma can be used to also ionize vapor, which is used as an "assisting" ion flux. Ions of various species (light and heavy) that either are reactive or non-reactive with the surface can be used to mediate assembly of the condensing species.

EXAMPLE NO. 1

Figure 6:
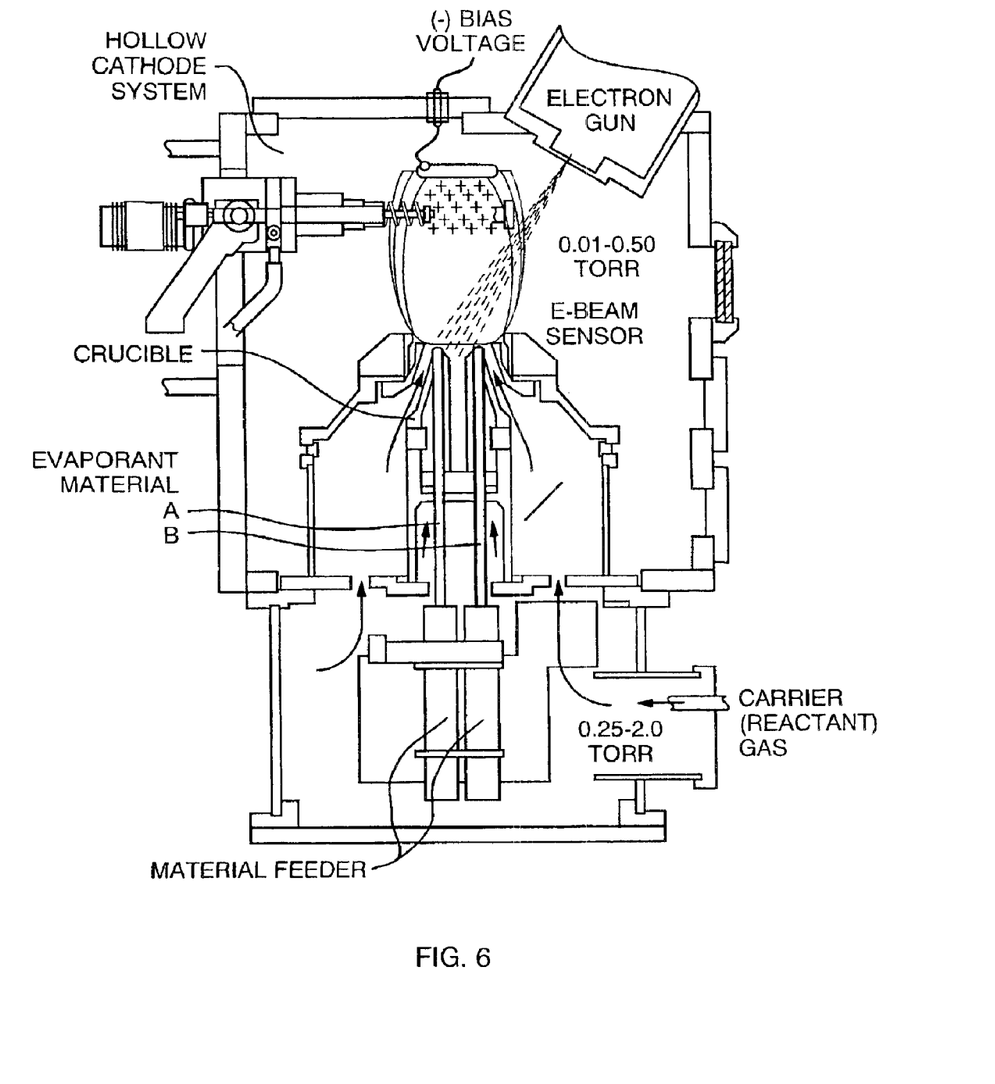
FIG. 6 provides a schematic view of an exemplary embodiment of the present invention FIG. 7 provides an enlarged partial view of the embodiment shown in FIG. 6.
Figure 7:
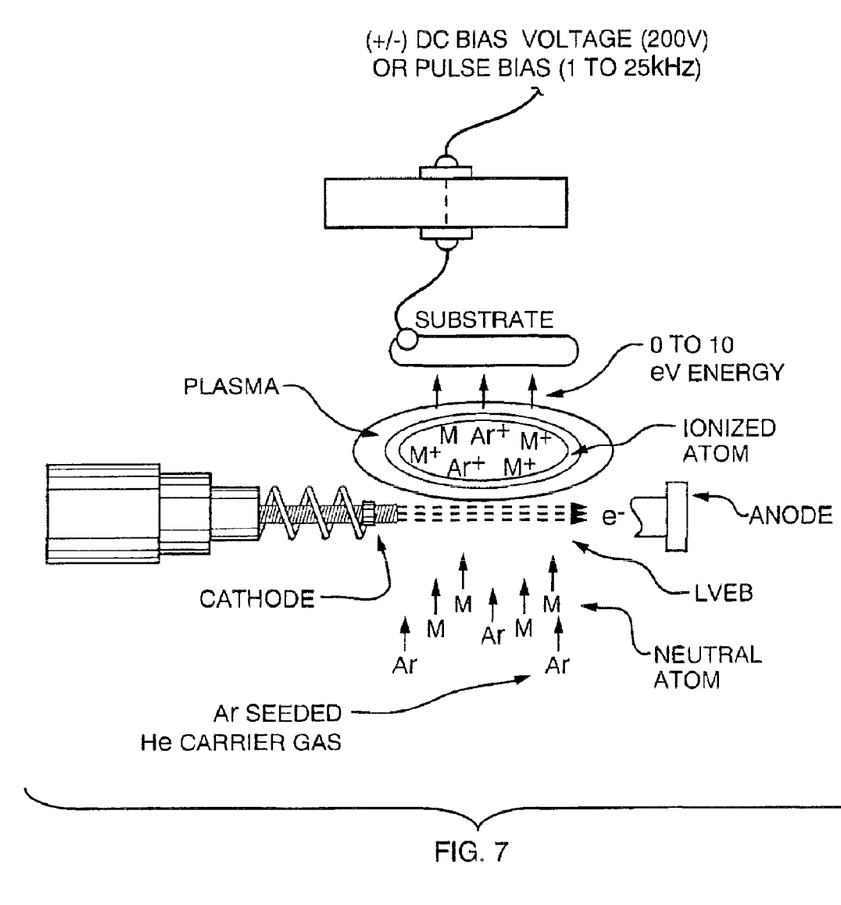

FIGS. 6–7 are schematic drawings representing an exemplary embodiment of the present invention, wherein FIG. 6 illustrates an enlarged partial view of the embodiment of FIG. 6.

The invention may be embodied in other specific forms without departing from the spirit or essential characteristics thereof. Of course, it should be understood that a wide range of changes and modifications can be made to the preferred embodiment described above. The foregoing embodiments are therefore to be considered in all respects illustrative rather than limiting of the invention described herein. Scope of the invention is thus indicated by the appended claims as read in light of the foregoing description, including all equivalents, and all changes which come within the meaning and range of equivalency of the claims are therefore intended to be embraced herein.

We claim:

1. A process for plasma activated vapor deposition onto a substrate comprising:

presenting a main gas and vapor stream to a chamber, wherein said chamber has an operating pressure of from about 1 microbar to about atmospheric pressure, said chamber further includes a substrate bias system capable of applying a DC or alternating potential to said substrate;

impinging said gas and vapor stream with a working gas and low voltage electron beam generated by at least one hollow cathode arc plasma activation source to ionize said gas and vapor stream; and attracting said ionized gas and vapor stream to a substrate surface by allowing a self-bias of said ionized gas and vapor stream or said potential to pull the ionized stream to said substrate.

2. The process of claim 1, wherein said vapor stream is generated from multiple, adjacent sources scanned and heated by a single electron beam source.

3. The process of claim 1, wherein said vapor stream is generated from multiple, adjacent sources scanned and heated by multiple electron beam sources.

4. The process of claim 1, wherein said vapor stream is a single vapor source and wherein said main gas is a single gas stream, said vapor stream is surrounded by said single gas stream.

5. The process of claim 1, wherein said vapor stream comprises multiple vapor sources and wherein said main gas is a single gas stream, said multiple vapor sources are surrounded by a single gas stream.

6. The process of claim 1, wherein said vapor stream comprises multiple vapor sources and wherein said main gas is a plurality of gas streams, wherein said multiple vapor sources are individually surrounded by a plurality of said gas streams.

7. The process of claim 1, wherein said generated electrons from said hollow cathode source is regulated for direction through variations in the quantity of working gas passing through said hollow cathode source, wherein the flow rate of the working gas is from about 0.01 to about 2 standard liters per minute.

8. The process of claim 1, wherein the distance between said cathode source and said vapor stream are matched with the width of said main gas and vapor stream for ionization of the entire gas flow, and wherein quantity of the working gas flowing through said hollow cathode has a flow rate being from about 0.01 to about 2 standard liters per minute.

9. The process of claim 1, wherein the directed electron flow from said cathode source is coupled with said substrate bias potential and said main gas and vapor flow to deposit atoms on the substrate surface with energies between about 0.05 and about 20 eV.

10. The process of claim 1, wherein any deflection of the main gas and vapor stream caused by said working gas of said hollow cathode source is compensated by an opposing gas flow from the opposite side of the main gas and vapor stream, whereby the main gas and vapor stream flows closer to said cathode source.

11. The process of claim 1, wherein said cathode generated electron beam is generated by a discharge current, said discharge current in said cathode source is varied during the process to modify the density of the ionized gas and vapor atoms traveling toward said substrate.

12. The process of claim 1, wherein said substrate bias conditions are varied during a process period to modify the energy of said ionized gas and vapor atoms of said ionized stream impacting upon said substrate.

13. The process of claim 12, wherein said substrate bias system is controlled by a bias voltage, bias operation mode, duty cycle times or duration of off-times to effect bias conditions.

14. The process of claim 1, wherein the quantity of working gas passing through said hollow cathode source is varied from 0.01 to about 2 standard liters per minute during the process to modify the energy of the ionized gas and vapor atoms impacting upon said substrate.

15. A process for preheating a substrate comprising:
presenting a gas stream to a to a chamber, wherein said chamber has an operating pressure of from about 1 microbar to about atmospheric pressure, said chamber further includes a substrate bias system capable of applying a positive potential to said substrate;
directing a low voltage electron beam generated by at least one of said hollow cathode arc plasma activation unit towards said substrate by means of collisions with the gas stream; and
attracting the low voltage electrons from at least one hollow cathode arc plasma activation units to said substrate by applying a positive bias to said substrate.

16. The process of claim 15, wherein said positive bias is applied using a positive DC bias.

17. The process of claim 15, wherein said positive bias is applied using a unipolar pulsed positive bias.

18. The process of claim 17, further comprising:
a power supply for supplying power to said substrate bias system, wherein duty cycles of the unipolar pulses are controlled for introduction of maximum heat flow according to the maximum power output of the bias power supply.

19. A process for precleaning a substrate comprising:
presenting a gas stream to a chamber, wherein said chamber has an operating pressure of from about 1 microbar to about atmospheric pressure and has coupled thereto a substrate bias system capable of applying a positive DC potential to said substrate;
impinging the gas stream with a low voltage electron beam generated by at least one hollow cathode arc plasma activation source to ionize the gas stream; and
attracting the ionized gas species from said ionized gas stream to said substrate by applying a negative DC or alternating bias to said substrate for energetic surface bombardment.

20. The process of anyone of claims 1, 15 or 19, wherein the distance between said cathode source and the boundary of said stream is between about 0 cm to about 5 cm.

21. An apparatus for plasma activated substrate deposition onto a substrate, comprising:
a vacuum chamber, wherein said chamber has an operating pressure of from about 1 microbar to about atmospheric pressure;
an electron beam evaporation system providing a gas and vapor stream in said chamber, said gas and vapor stream guided towards said substrate;
a substrate bias system capable of applying a DC or alternating potential to said substrate;
at least one hollow cathode arc source generating a low voltage electron beam, each of said cathode arc source having at least one cathode orifice wherein a predetermined selection of said orifices are arranged in close proximity to the gas and vapor stream; and
an anode is arranged opposite of said cathode source wherein the gas and vapor stream is there between said cathode source and said anode.

22. The apparatus according to claim 21, further comprising:
a power supply for providing power to said cathode and said anode; and
an electrical power line connected between said power supply and said cathode and an electrical return power line connected between said power supply and said anode, wherein said electrical power line for said cathode and said electrical return power line of the anode are closely neighboring or concentrically arranged.

23. The apparatus according to claim 21, wherein the distance between said cathode and the gas and vapor stream is adjustable and/or the distance between said anode and the gas and vapor stream is adjustable.

24. The apparatus according to claim 21, wherein both of said cathode and anode can be moved or turned away from the gas and vapor stream without interrupting the plasma discharge.

25. The apparatus according to claim 21, wherein said anode can be moved or turned away from the gas and vapor stream without interrupting the plasma discharge.

26. The apparatus according to claim 21, wherein said cathode can be moved or turned away from the gas and vapor stream without interrupting the plasma discharge.

27. The apparatus according to claim 21, further comprising:
an auxiliary anode positioned proximal to said anode; and
a switch in electrical communication with said electrical return power line, said switch effecting operation between said auxiliary anode and said power supply, wherein upon actuation said switch is adapted to operatively switch connections from a first position, wherein power is normally supplied to said anode, to a second position wherein power is supplied to said auxiliary anode.

28. The apparatus according to claim 21, further comprising:
a substrate holder for holding said substrate; and
a DC voltage, variable from zero to about 300 V, having a positive pole that is connected to said substrate or said substrate holder as bias voltage.

29. The apparatus according to claim 21, further comprising:
a substrate holder for holding said substrate; and
a DC voltage, variable from zero to about 300 V, having a negative pole that is connected to said substrate or said substrate holder as bias voltage.

30. The apparatus according to claim 21, further comprising:
a substrate holder for holding said substrate; and
a DC voltage, variable from zero to about 300 V, having a unipolar pulsed or bipolar pulsed DC voltage or a medium frequency AC voltage that is connected to said substrate or said substrate holder as bias voltage.

31. The apparatus according to claim 30, wherein:
duty cycles of operating said bias voltage can be adjusted between about 8 and about 815 $\mu$s independently for each polarity; and
duration of off time between the duty cycles is from about 2 $\mu$s to about 815 $\mu$s.

32. The apparatus according to claim 21, wherein:
said anode is made from material which is conductive and stable at high temperatures.

33. The apparatus according to claim 21, wherein the distance between said cathode source and the boundary of said stream is between about 0 cm to about 5 cm.

34. The apparatus according to claim 21, further comprising:
at least one of a plurality of channels are located proximately to the guided gas and vapor stream and on substantially opposite side of the guided gas and vapor stream from said cathode source; and
said channels are adapted to generate a gas flow substantially towards said cathode source so as to compensate for any or partial deflection incurred by the guided gas and vapor stream.

35. The apparatus according to claim 34, wherein one or more of said channels are disposed on said anode.

* * * * *